US008717542B2

(12) United States Patent
Sogard

(10) Patent No.: US 8,717,542 B2
(45) Date of Patent: May 6, 2014

(54) FLUID GAUGE WITH MULTIPLE REFERENCE GAPS

(75) Inventor: Michael R. Sogard, Menlo Park, CA (US)

(73) Assignee: Nikon Corporation, Tokyo (JP)

( * ) Notice: Subject to any disclaimer, the term of this patent is extended or adjusted under 35 U.S.C. 154(b) by 505 days.

(21) Appl. No.: 12/980,064

(22) Filed: Dec. 28, 2010

(65) Prior Publication Data
US 2011/0157576 A1  Jun. 30, 2011

Related U.S. Application Data

(60) Provisional application No. 61/291,285, filed on Dec. 30, 2009.

(51) Int. Cl.
*G03B 27/58* (2006.01)
*G03B 27/52* (2006.01)

(52) U.S. Cl.
USPC .............................................. 355/72; 355/55

(58) Field of Classification Search
USPC ................................ 355/55, 72, 77
See application file for complete search history.

(56) References Cited

U.S. PATENT DOCUMENTS

| 5,540,082 A | 7/1996 | Okuyama et al. |
| 2004/0118183 A1* | 6/2004 | Gajdeczko et al. ............ 73/37.5 |

OTHER PUBLICATIONS

Michael Sogard, entitled "Physical Sensor for Autofocus System," U.S. Appl. No. 12/879,113, filed Sep. 10, 2010 (not yet published).

* cited by examiner

*Primary Examiner* — Peter B Kim
(74) *Attorney, Agent, or Firm* — Roeder & Broder LLP

(57) ABSTRACT

A fluid gauge (222) for measuring the position of a work piece (200) includes a gauge body (236), a fluid source assembly (238), and a gauge control system (240). The gauge body (236) includes a measurement conduit (246), a first reference conduit (248A), a second reference conduit (248B), a first reference surface (250A) that is spaced apart a first reference gap (242A) from an outlet (254) of the first reference conduit (248A), and a second reference surface (250B) that is spaced apart a second reference gap (242B) from an outlet (254) of the second reference conduit (248B). The gauge body (236) is positioned so that an outlet (254) of the measurement conduit (246) is spaced apart a measurement gap (244) from the work piece (200). Further, the fluid source assembly (238) directs a fluid (260) into the conduits (246), (248A), (248B). Moreover, the gauge control system (240) determines (i) a first pressure difference between a measurement pressure (264) and a first reference pressure (262A); and (ii) a second pressure difference between the measurement pressure (264) and a second reference pressure (262B).

27 Claims, 11 Drawing Sheets

FLUID GAUGE WITH MULTIPLE REFERENCE GAPS

RELATED APPLICATION

The application claims priority on Provisional Application Ser. No. 61/291,285 filed on Dec. 30, 2009, entitled "AIR GAUGE WITH LARGE DYNAMIC RANGE". As far as is permitted, the contents of Provisional Application Ser. No. 61/291,285 are incorporated herein by reference.

BACKGROUND

Exposure apparatuses are commonly used to transfer images from a reticle onto a semiconductor wafer during semiconductor processing. A typical exposure apparatus includes an illumination source, a reticle stage assembly that positions a reticle, an optical assembly having an optical axis, a wafer stage assembly that positions a semiconductor wafer, a measurement system, and a control system. The measurement system constantly monitors the position of the reticle and the wafer, and the control system controls each stage assembly to constantly adjust the position of the reticle and the wafer. The features of the images transferred from the reticle onto the wafer are extremely small. Accordingly, the precise positioning of the wafer and the reticle is critical to the manufacturing of high quality wafers.

In certain designs, the measurement system includes an autofocus system that monitors the position of the wafer along the optical axis. Subsequently, with information regarding the position along the optical axis, the wafer stage assembly can be controlled to properly position the wafer along the optical axis.

One type of autofocus system includes a slit light source that illuminates a set of slits and an imaging system that projects the set of slits onto the wafer at a glancing angle of incidence. The light reflected from the wafer is then directed to a slit detector assembly that determines the position of the wafer along the optical axis. Unfortunately, instabilities in the autofocus system and other conditions can adversely influence the accuracy of the autofocus system and ultimately the accuracy in which the wafer is positioned along the optical axis. For example, patterns on the wafer influence the reflectivity of the wafer and can adversely influence the accuracy of the autofocus system. Further, environmental effects such as the refractive index changes of air due to temperature, atmospheric pressure, and/or humidity changes or gradients can adversely influence the accuracy of the autofocus system.

SUMMARY

The present invention is directed to a fluid gauge measurement system for measuring the position of a work piece along an axis. In one embodiment, the fluid gauge includes a gauge body, a fluid source assembly, and a gauge control system. For example, the gauge body can include a measurement conduit, a first reference conduit, a second reference conduit, a first reference surface that is positioned adjacent to and spaced apart a first reference gap from an outlet of the first reference conduit, and a second reference surface that is positioned adjacent to and spaced apart a second reference gap from an outlet of the second reference conduit. In this embodiment, the gauge body is positioned so that an outlet of the measurement conduit is positioned adjacent to and spaced apart from the work piece. Further, the fluid source assembly directs a fluid into the measurement conduit, the first reference conduit and the second reference conduit.

Moreover, the gauge control system can determine the position of the work piece based on information from the fluid in the conduits. For example, the gauge control system can determine (i) a first pressure difference between a measurement pressure in the measurement conduit and a first reference pressure in the first reference conduit, (ii) a second pressure difference between the measurement pressure and a second reference pressure in the second reference conduit, and (iii) the position of the work piece along the axis utilizing at least one of the pressure differences. Alternatively, a fluid flow induced by the pressure difference between a measurement pressure and a reference pressure in a reference conduit could be used to determine the position of the work piece.

With this design, the fluid gauge can be used to measure the height of a photoresist-coated wafer surface and the accuracy of the system is relatively insensitive to patterns on the wafer, and to thin film effects. Moreover, because, the present fluid gauge utilizes multiple reference gaps and multiple pressure differences, the dynamic range of the fluid gauge is relative large.

In certain embodiments, the gauge control system includes a first pressure sensor that measures the first pressure difference, and a second pressure sensor that measures the second pressure difference. Moreover, the gauge control system determines which of the pressure differences is the smallest and determines the position of the work piece along the axis utilizing the pressure difference that is the smallest. With this design, each pressure sensor can have a smaller pressure range, while still achieving the desired sensitivity of the fluid gauge. As a result thereof, measurements taken with the fluid gauge are more accurate and the work piece can be positioned with improved accuracy.

Additionally, the gauge body can include a third reference conduit, and a third reference surface that is positioned adjacent to and spaced apart a third reference gap from an outlet of the third reference conduit. In this embodiment, the fluid source assembly also directs the fluid into the third reference conduit, and the control system determines a third pressure difference between the measurement pressure and a third reference pressure in the third reference conduit. Moreover, in one embodiment, the third reference gap is greater than the second reference gap, and the second reference gap is greater than the first reference gap. Further, the control system can determine which of the pressure differences is the smallest, and the control system can determine the position of the work piece along the axis utilizing the pressure difference which is the smallest.

The present invention is also directed to a stage assembly that moves a work piece, the stage assembly including a stage that retains the work piece and the fluid gauge described herein. In yet another embodiment, the present invention is directed to an exposure apparatus that includes an illumination system and a stage assembly that moves the stage relative to the illumination system. In still another embodiment, the present invention is directed to a process for manufacturing a device that includes the steps of providing a substrate and forming an image to the substrate with the exposure apparatus.

Additionally, the present invention is directed to a method for measuring the position of a work piece along an axis that is orthogonal to a working surface of the work piece, the method comprising the steps of: (i) providing a gauge body that includes a measurement conduit, a first reference conduit, a second reference conduit, a first reference surface that is positioned adjacent to and spaced apart from an outlet of the first reference conduit, and a second reference surface that is positioned adjacent to and spaced apart from an outlet of the second reference conduit; (ii) positioning the gauge body so that an outlet of the measurement conduit is positioned adjacent to and spaced apart from the work piece; (iii) directing a fluid into the measurement conduit, the first reference conduit and the second reference conduit with a fluid source assembly; (vi) determining a first pressure difference between a measurement pressure in the measurement conduit and a first reference pressure in the first reference conduit with a gauge control system; and (v) determining a second pressure difference between the measurement pressure and a second reference pressure in the second reference conduit with the gauge control system.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
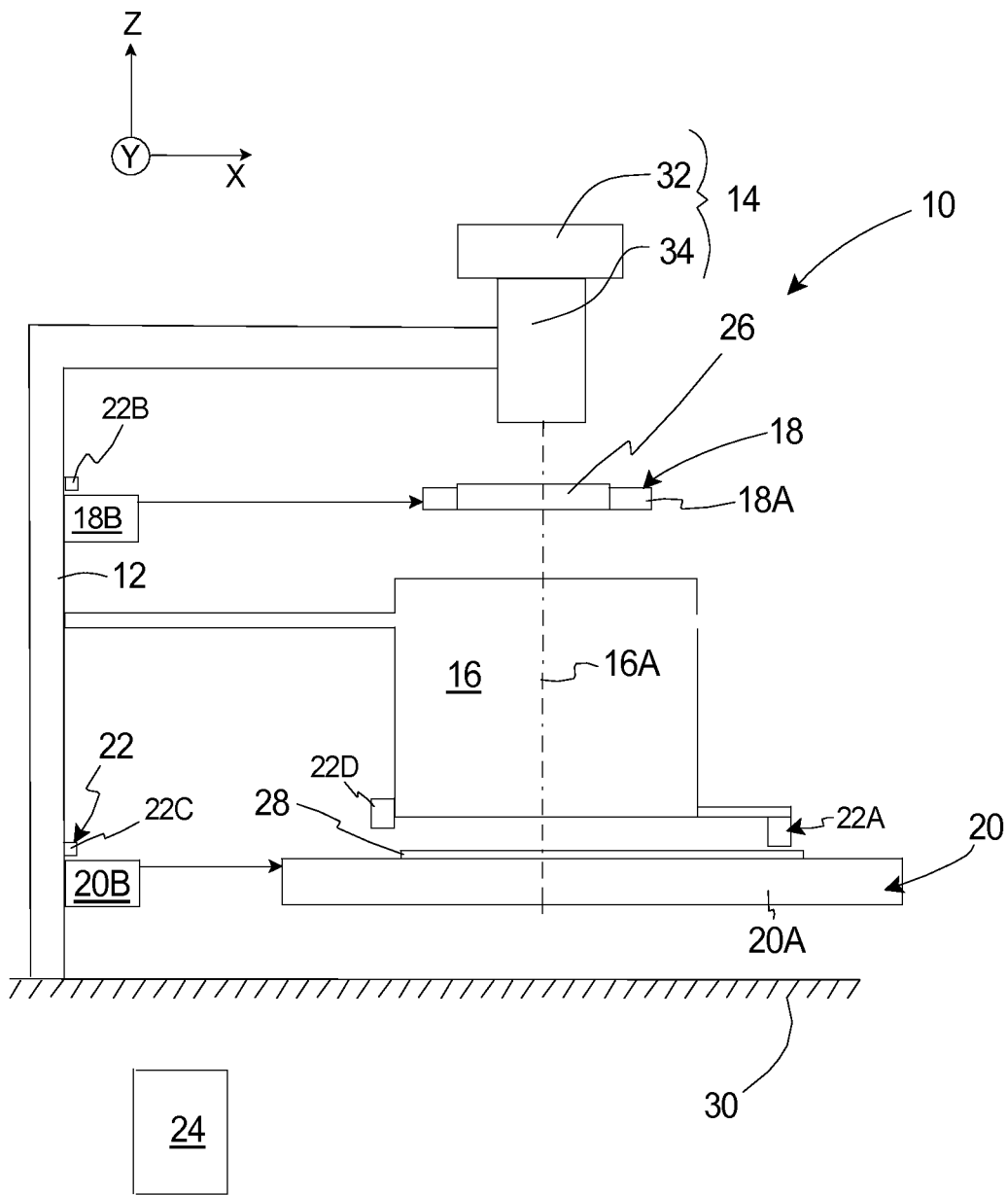
FIG. 1 is a schematic illustration of an exposure apparatus having features of the present invention.

FIG. 1 is a schematic illustration of a precision assembly, namely an exposure apparatus 10 having features of the present invention. The exposure apparatus 10 includes an apparatus frame 12, an illumination system 14 (irradiation apparatus), an optical assembly 16, a reticle stage assembly 18, a wafer stage assembly 20, a position system 22, and an apparatus control system 24. The design of the components of the exposure apparatus 10 can be varied to suit the design requirements of the exposure apparatus 10. The exposure apparatus 10 is particularly useful as a lithographic device that transfers a pattern (not shown) of an integrated circuit from a reticle 26 onto a semiconductor wafer 28. The exposure apparatus 10 mounts to a mounting base 30, e.g., the ground, a base, or floor or some other supporting structure.

As an overview, the position system 22 includes a fluid gauge measurement system 22A (illustrated as a box and sometimes referred to as a "fluid gauge") that measures the position of a work piece, e.g. the wafer 28, along an axis (e.g. the Z axis) with improved accuracy. Further, in certain embodiments, the fluid gauge measurement system 22A is uniquely designed so that environmental conditions near the work piece and/or a photoresist-coated surface of the wafer 28 do not adversely influence the accuracy of the fluid gauge 22A. Moreover, as described in detail below, because the present fluid gauge 22A utilizes multiple references, the dynamic range of the fluid gauge 22A is relative large. As a result thereof, the wafer 28 can be positioned with improved accuracy, and the exposure apparatus 10 can be used to manufacture higher density wafers 28.

A number of Figures include an orientation system that illustrates an X axis, a Y axis that is orthogonal to the X axis, and the Z axis that is orthogonal to the X and Y axes. It should be noted that any of these axes can also be referred to as the first, second, and/or third axes.

There are a number of different types of lithographic devices. For example, the exposure apparatus 10 can be used as a scanning type photolithography system. Alternatively, the exposure apparatus 10 can be a step-and-repeat type photolithography system. However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head.

The apparatus frame 12 is rigid and supports the components of the exposure apparatus 10. The apparatus frame 12 illustrated in FIG. 1 supports the reticle stage assembly 18, the optical assembly 16, the wafer stage assembly 20, and the illumination system 14 above the mounting base 30.

The illumination system 14 includes an illumination source 32 and an illumination optical assembly 34. The illumination source 32 emits a beam (irradiation) of light energy. The illumination optical assembly 34 guides the beam of light energy from the illumination source 32 to the optical assembly 16. The illumination source 32 can be a mercury lamp g-line source (436 nm), a mercury lamp i-line source (365 nm), a KrF excimer laser (248 nm), an ArF excimer laser (193 nm), a $F_2$ laser (157 nm), or an EUV source (13.5 nm). Alternatively, the illumination source 32 can generate charged particle beams such as an x-ray or an electron beam.

The optical assembly 16 projects and/or focuses the light leaving the reticle 26 to the wafer 28. Depending upon the design of the exposure apparatus 10, the optical assembly 16 can magnify or reduce the image illuminated on the reticle 26.

The reticle stage assembly 18 holds and positions the reticle 26 relative to the optical assembly 16 and the wafer 28. In FIG. 1, the reticle stage assembly 18 includes a reticle stage 18A that retains the reticle 26, and a reticle stage mover assembly 18B that positions the reticle stage 18A and the reticle 26. The reticle stage mover assembly 18B can be designed to move the reticle 26 along the X, Y and Z axes, and about X, Y and Z axes.

Somewhat similarly, the wafer stage assembly 20 holds and positions the wafer 28 with respect to the projected image of the illuminated portions of the reticle 26. In FIG. 1, the wafer stage assembly 20 includes a wafer stage 20A that retains the wafer 28, and a wafer stage mover assembly 20B that positions the wafer stage 20A and the wafer 28. The wafer stage mover assembly 20B can be designed to move the wafer 28 along the X, Y and Z axes, and about X, Y and Z axes.

The position system 22 monitors movement of the reticle 26 and the wafer 28 relative to the optical assembly 16 or some other reference. With this information, the apparatus control system 24 can control the reticle stage assembly 18 to precisely position the reticle 26 and the wafer stage assembly 20 to precisely position the wafer 28. For example, the position system 22 can utilize multiple laser interferometers, encoders, autofocus systems, and/or other measuring devices.

In FIG. 1, the position system 22 includes (i) a reticle measurement system 22B (illustrated as a box) that monitors the position of the reticle stage 18B and the reticle 26, (ii) a wafer measurement system 22C (illustrated as a box) that monitors the position of the wafer stage 20A along the X and Y axes, and about the Z axis, and (iii) the fluid gauge 22A that monitors the position of the wafer 28 relative to the optical assembly 16 along an optical axis 16A (e.g. the Z axis).

Additionally, in certain embodiments, the position system 22 can include an autofocus system 22D (illustrated as a box) that monitors the position of the wafer 28 relative to the optical assembly 16 along the Z axis (the optical axis 16A), about the X axis, and about the Y axis. A suitable autofocus system 22D is a slit type system that directs a plurality of slit images of light at a glancing angle of incidence at the wafer 28 and measures the light reflected off of the wafer 28. A further discussion of a slit type autofocus system 22D is contained in U.S. Pat. No. 4,650,983. As far as permitted, the contents of U.S. Pat. No. 4,650,983 are incorporated herein by reference. In one non-exclusive embodiment, the fluid gauge 22A can be used in conjunction with the autofocus system 22D to calibrate the autofocus system 22D prior to processing (e.g. transferring images) the wafer 28 to improve the accuracy of the autofocus system 22D.

The apparatus control system 24 is connected to the reticle stage assembly 18, the wafer stage assembly 20, and the position system 22. The apparatus control system 24 receives information from the position system 22 and controls the stage assemblies 18, 20 to precisely position the reticle 26 and the wafer 28. The apparatus control system 24 can include one or more processors and circuits.

Figure 2:
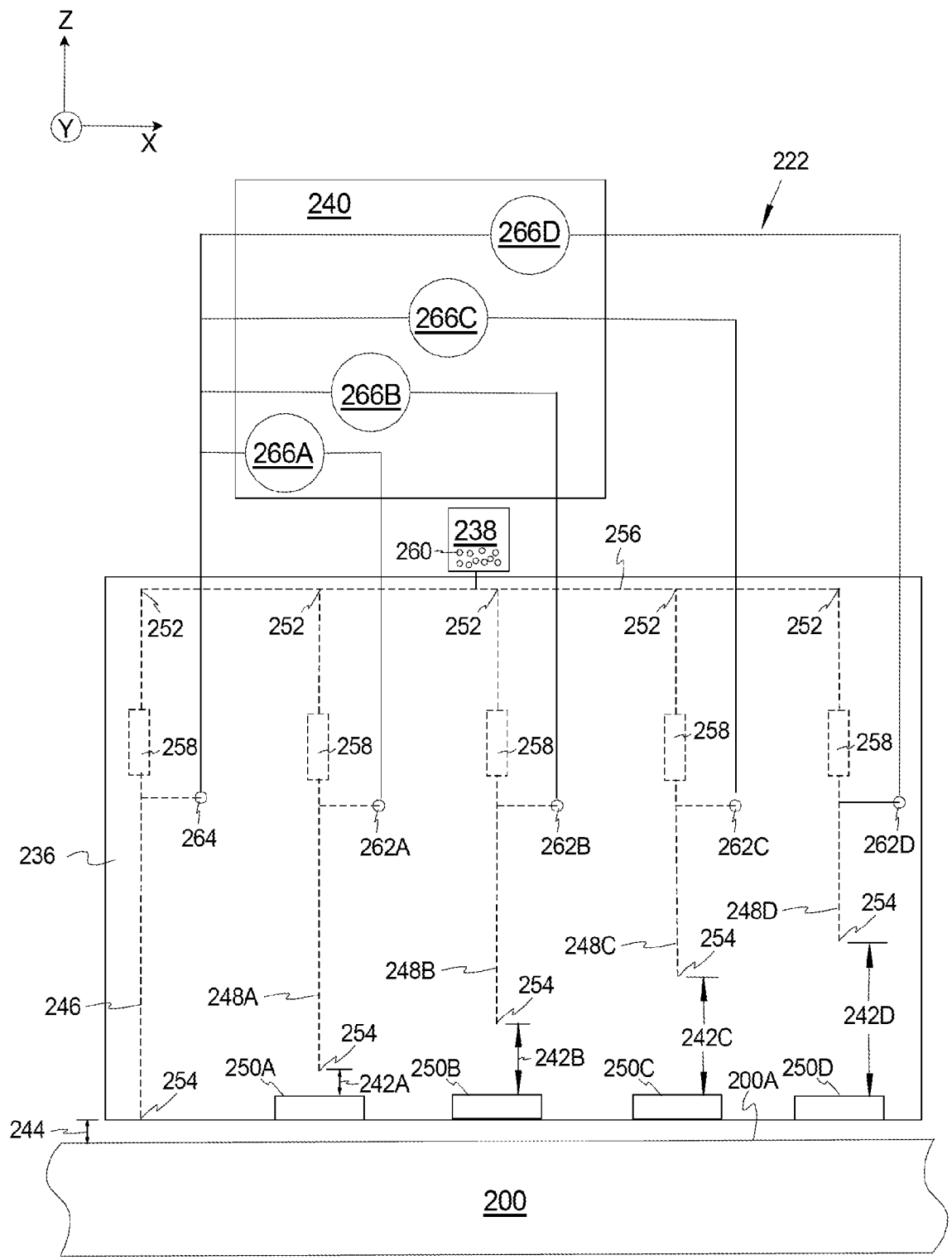
FIG. 2 is a simplified schematic of a fluid gauge measurement system having features of the present invention and a work piece.

FIG. 2 is a simplified schematic illustration of a work piece 200, and a first embodiment of a fluid gauge 222 that measures the position of a working surface 200A of the work piece 200 along the Z axis relative to a reference (e.g. the optical assembly 16 illustrated in FIG. 1). In this embodiment, for example, the work piece 200 can be the wafer 28 (illustrated in FIG. 1) and the working surface 200A can be the surface where the features are transferred. Alternatively, the fluid gauge 222 can be used to monitor the position of other types of work pieces 200 (e.g. the reticle 26 illustrated in FIG. 1) during manufacturing and/or inspection.

In certain embodiments, the position of the work piece 200 along the Z axis for each X, Y position can be premapped with the fluid gauge 222 prior to exposing the work piece 200. With this design, for each X, Y position of the work piece 200, the apparatus control system 24 (illustrated in FIG. 1) can control the wafer stage mover assembly 20B (illustrated in FIG. 1) to make the appropriate adjustments to the Z position of the work piece 200 based on the premapped information.

In FIG. 2, the fluid gauge 222 includes a gauge body 236, a fluid source assembly 238, and a gauge control system 240. In one embodiment, the gauge body 236 defines a plurality of fixed, known reference gaps 242A-242D and the gauge body 236 is maintained adjacent to the work piece 200 to define an unknown measurement gap 244 between the gauge body 236 and the work piece 200. As provided herein, the fluid gauge 222 is utilized to determine the measurement gap 244. Subsequently, the position of the work piece 200 relative to the reference can be determined utilizing the known position of the fluid gauge 222 relative to the reference and the measurement gap 244 determined with the fluid gauge 222.

The number of reference gaps 242A-242D can be varied to achieve the desired accuracy, dynamic range, and size requirements of the fluid gauge 222. In the schematic illustrated in FIG. 2, the fluid gauge 222 defines four reference gaps, including a first reference gap 242A, a second reference gap 242B, a third reference gap 242C, and a fourth reference gap 242D. Alternatively, the fluid gauge 222 can be designed to define more than four or fewer than four reference gaps 242A-242D.

Moreover, in FIG. 2, the gauge body 236 includes a measurement conduit 246 (illustrated with dashed lines), a first reference conduit 248A (illustrated with dashed lines), a second reference conduit 248B (illustrated with dashed lines), a third reference conduit 248C (illustrated with dashed lines), a fourth reference conduit 248D (illustrated with dashed lines), a first reference surface 250A, a second reference surface 250B, a third reference surface 250C, and a fourth reference surface 250D. Further, each conduit 246, 248A-248D includes an inlet 252 and an outlet 254. In this embodiment, the inlet 252 of each conduit 246, 248A-248D is in fluid communication with the fluid source assembly 238 via a manifold 256. Further, (i) the first reference surface 250A is positioned adjacent to and spaced apart the first reference gap 242A from the outlet 254 of the first reference conduit 248A, (ii) the second reference surface 250B is positioned adjacent to and spaced apart the second reference gap 242B from the outlet 254 of the second reference conduit 248B, (iii) the third reference surface 250C is positioned adjacent to and spaced apart the third reference gap 242C from the outlet 254 of the third reference conduit 248C, and (iv) the fourth reference surface 250D is positioned adjacent to and spaced apart the fourth reference gap 242D from the outlet 254 of the fourth reference conduit 248D. Moreover, the conduits 246, 248A-248D are arranged in parallel (e.g. the conduits 246, 248A-248D are arranged and connected so that the fluid 260 flows through each of the conduits 246, 248A-248D at approximately the same time).

The size of each conduit 246, 248A-248D can be varied to suit the design requirements of the fluid gauge 222. In one non-exclusive embodiment, each conduit 246, 248A-248D has an inner diameter of between approximately 0.01 mm and 1 mm.

As provided herein, in certain embodiments, the size (the distance between the outlet and its corresponding reference surface) of each fixed reference gap 242A-242D is different. More specifically, in FIG. 2, the fourth reference gap 242D is greater than the third reference gap 242C; the third reference gap 242C is greater than the second reference gap 242B; and the second reference gap 242B is greater than the first reference gap 242A. It should be noted that in the embodiment illustrated in FIG. 2, the differences in the size of the reference gaps 242A-242D is greatly exaggerated for ease of illustration. In certain embodiments, the reference gaps 242A-242D differ in incremental steps. Alternatively, the reference gaps 242A-242D can differ in non-incremental steps.

Moreover, as provided herein, the gauge body 236 can be designed so that for each X, Y position of the work piece 200, during the measurement process, at least one of the reference gaps 242A-242D is relatively close to the measurement gap 244 to avoid offsets and environmental disturbances which degrade the measurement accuracy. Thus, the gauge body 236 should be designed so that the reference gaps 242A-242D are distributed along the anticipated range of possible measurement gaps 244. With this embodiment, the multiple, different reference gaps 242A-242D are provided so that the dynamic range of the fluid gauge 222 is increased. As a non-exclusive example, the fixed fourth reference gap 242D can be approximately 43 μm; the fixed third reference gap 242C can be approximately 26 μm; the fixed second reference gap 242B can be approximately 18 μm; and the fixed first reference gap 242A can be approximately 12 μm.

In one embodiment, each of the conduits 246, 248A-248D includes a flow restrictor 258 that restricts the flow of the fluid 260 (illustrated with small circles) from the fluid source assembly 238. Each flow restrictor 258 isolates the pressure measurements associated with the differential pressure signal from variations in the supply pressure from the fluid source assembly 238. Stated in another fashion, the flow restrictors 258 inhibit small changes in the supply pressure from the fluid source assembly 238 from adversely influencing the pressures in the conduits 246, 248A-248D. Flow restrictors 258 may be, but are not limited to being, orifices, capillary tubes, and/or porous plugs. As will be appreciated by those skilled in the art, capillary tubes and porous plugs are generally laminar flow restrictors.

The fluid source assembly 238 simultaneously directs the fluid 260 (e.g. air or another type of gas) into the measurement conduit 246, and the reference conduits 248A-248D. With this design, (i) the fluid 260 exiting the measurement conduit 246 is directed at the work piece 200; (ii) the fluid 260 exiting the first reference conduit 248A is directed at the first reference surface 250A; (iii) the fluid 260 exiting the second reference conduit 248B is directed at the second reference surface 250B; (iv) the fluid 260 exiting the third reference conduit 248C is directed at the third reference surface 250C; and (v) the fluid 260 exiting the fourth reference conduit 248D is directed at the fourth reference surface 250D. Not shown are ports allowing the fluid 260 directed to a reference surface to subsequently exhaust to ambient.

The amount of pressure in the conduits 246, 248A-248D created by the fluid source assembly 238 can be varied. As non-exclusive embodiments, the fluid source assembly 238 can direct sufficient fluid 260 so that the pressure in the conduits 246, 248A-248D is in the range of between approximately 12 kPa gauge to 60 kPa gauge, for the case of a supply pressure from the fluid source assembly 238 of approximately 200 kPa gauge. It should be noted that the flow rate and the amount of pressure created in the conduits 246, 248A-248D will depend upon the size of the respective gap 242A-242D, 244 (e.g. pressure will decrease as the gap size increases). Thus, in the embodiment illustrated in FIG. 2, (i) a first reference pressure 262A in the first reference conduit 248A will be greater than a second reference pressure 262B in the second reference conduit 248B; (ii) the second reference pressure 262B will be greater than a third reference pressure 262C in the third reference conduit 248C; and (iii) the third reference pressure 262C will be greater than a fourth reference pressure 262D in the fourth reference conduit 248D.

Further, a measurement pressure 264 in the measurement conduit 246 will vary according to the position of the working surface 200A along the Z axis. Stated in another fashion, as the measurement gap 244 varies, the flow of fluid 260 through the measurement conduit 246 changes and the measurement pressure 264 changes. More specifically, the fluid 260 exiting the outlet 254 of the measurement conduit 246 forms a fluid bearing with the work piece 200, and the fluid 260 exiting the outlets 254 of the reference conduits 248A-248D each form a fluid bearing with the respective reference surface 250A-250D. This creates an internal pressure in the respective conduits 246, 248A-248D that is dependent upon the respective size of the gap 244, 248A-248D. In certain embodiments, the structures of conduits 246, 248A-248D should be similar.

The gauge control system 240 can determine the position of the work piece 200 based on information regarding the fluid 260 in the conduits 246, 248A-248D. The gauge control system 240 can include one or more processors.

In one embodiment, the gauge control system 240 determines a pressure difference between the measurement pressure 264 and each of the reference pressures 262A-262D, and subsequently determines the position of the working surface 200A along the Z axis based on at least one of the pressure differences. Stated in another fashion, the gauge control system 240 determines the position of the working surface 200A along the Z axis by comparing the measurement pressure 264 for an unknown measurement gap 244 to the reference pressures 262A-262D for the known, fixed reference gaps 242A-242D.

In FIG. 2, the gauge control system 240 includes (i) a first sensor 266A, a second sensor 266B, a third sensor 266C, and a fourth sensor 266D. In one embodiment, (i) the first sensor 266A is a pressure sensor that senses a first pressure difference between the measurement pressure 264 and the first reference pressure 262A; (ii) the second sensor 266B is a pressure sensor that senses a second pressure difference between the measurement pressure 264 and the second reference pressure 262B; (iii) the third pressure sensor 266C is a pressure sensor that senses a third pressure difference between the measurement pressure 264 and the third reference pressure 262C; and (iv) the fourth pressure sensor 266D is a pressure sensor that senses a fourth pressure difference between the measurement pressure 264 and the fourth reference pressure 262D. Thus, with this embodiment, instead of a single pressure difference measurement, there are multiple pressure difference measurements.

Subsequently, in certain embodiments, the control system 240 determines which of the pressure differences is the smallest and determines the position of the work piece 200 along the Z axis utilizing the pressure difference which is the smallest. By using the smallest pressure difference, pressure sensors 266A-266D with a relatively high resolution and relatively small pressure range can be utilized. As is known, it is very difficult to find pressure sensors 266A-266D having a relatively high resolution and a relatively large pressure range. Thus, with the use of multiple different reference gaps 242A-242D, pressure sensors 266A-266D with a relatively high resolution and relatively small pressure range can be utilized.

The sensitivity of the fluid gauge 222 is defined as the change in pressure difference between measurement pressure and reference pressure for a unit change in measurement gap. As a non-exclusive example, a sensitivity of an fluid gauge 222 can be approximately 4 Pa/nm. Thus, in order to provide a height measurement with a resolution of 1 nm, the resolution of the pressure sensor 266A-266D must exceed 4 Pa by some amount. The sensitivity also defines the effective dynamic range of the fluid gauge 222 for a given pressure sensor 266A-266D. Sensitive pressure sensors 266A-266D are frequently limited in dynamic range. For example, if the dynamic range of a sensor 266A-266D is 10 kPa, the above sensitivity of 4 Pa/nm would limit air gauge operation, for a single reference channel, to approximately 2500 nm.

In certain embodiments, the reference gaps 242A-242D are spaced so the dynamic ranges of the differential pressure sensors 266A-266D associated with adjacent reference gap 242A-242D overlap. This increases the effective dynamic pressure range of the fluid gauge 222 by approximately the number of reference gaps 242A-242D. In one non-exclusive embodiment, a suitable pressure sensor 266A-266D has a resolution in the order of approximately 1 Pa for a pressure range of approximately 10 kPa.

In certain embodiments, the multiple differential pressure signals are monitored continuously, and the one with the smallest value is recorded.

In the embodiment illustrated in FIG. 2, the measurement gap 244 is illustrated as being approximately the same size as the known, fixed first reference gap 242A. Thus, the first pressure difference between the measurement pressure 264 and the first reference pressure 262A will be the smallest. Accordingly, in this example, the gauge control system 240 will use the first pressure difference to determine the unknown measurement gap 244 based on the size of the first reference gap 242A. Alternatively, when the measurement gap 244 is closest to the known, fixed second reference gap 242B, the second pressure difference will be the smallest.

It should be noted that with the present invention, the fluid gauges provided herein each utilize multiple references (e.g. multiple reference pressures 262A-262D or multiple reference flows) so that the dynamic range of the fluid gauge is relative large.

In an alternative embodiment, instead of pressure sensors, each of the sensors 266A-266D can be a flow sensor. In this embodiment, (i) the first sensor 266A is a flow sensor that senses a change is flow between the measurement conduit 246 and the first reference conduit 248A; (ii) the second sensor 266B is a flow sensor that senses a change is flow between the measurement conduit 246 and the second reference conduit 248B; (iii) the third sensor 266C is a flow sensor that senses a change is flow between the measurement conduit 246 and the third reference conduit 248C; and (iv) the fourth sensor 266D is a flow sensor that senses a change is flow between the measurement conduit 246 and the fourth reference conduit 248D. Thus, with this embodiment, instead of a single flow difference measurement, there are multiple flow difference measurements.

Further, in this embodiment, the control system 240 determines which of the flow differences is the smallest and determines the position of the work piece 200 along the Z axis utilizing the flow difference which is the smallest. By using the smallest flow difference, flow sensors 266A-266D with a relatively high resolution and relatively small flow range can be utilized. It should be noted that the flow sensors can be also be implemented instead of the pressure sensors in subsequent embodiments disclosed herein.

Figure 3A:
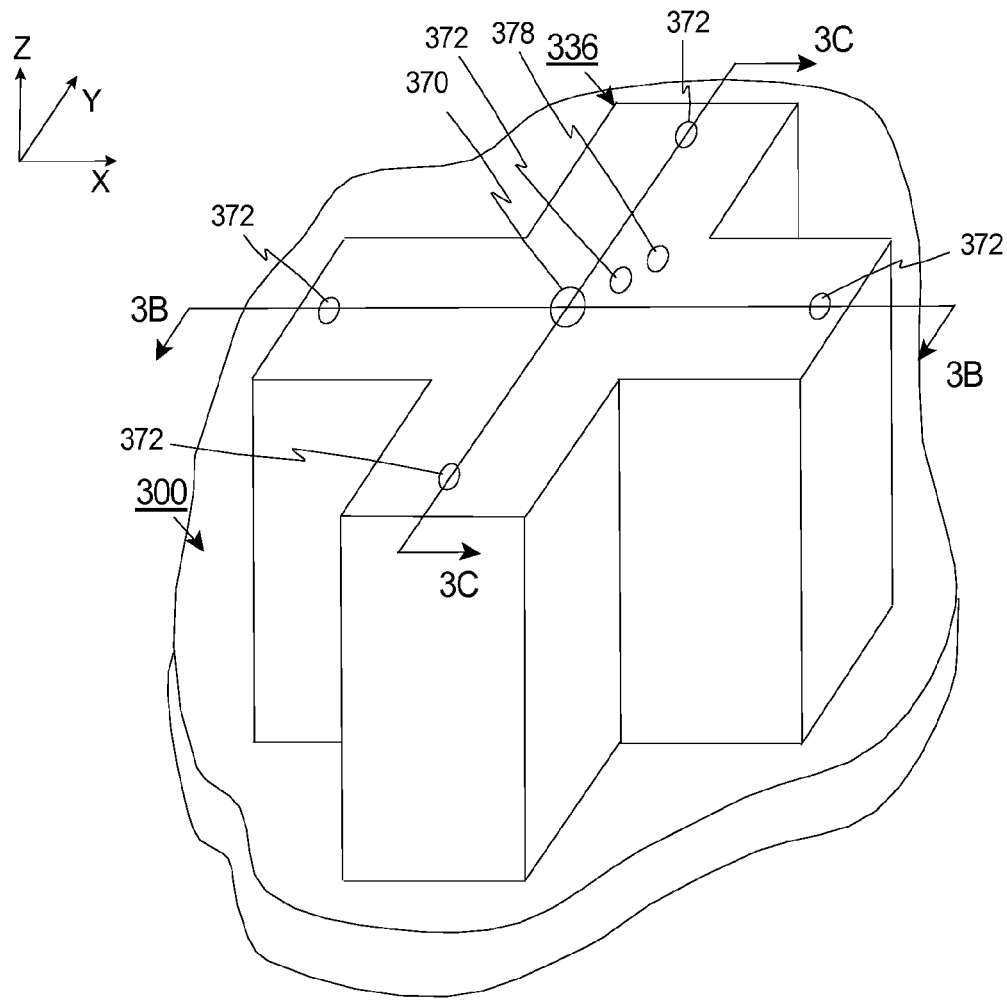
FIG. 3A is a simplified perspective view of a portion of a first embodiment of a fluid gauge measurement system having features of the present invention and a portion of a work piece.

FIG. 3A is a simplified perspective view of one, non-exclusive embodiment of a gauge body 336 and a portion of a work piece 300. In this embodiment, the gauge body 336 is shaped somewhat similar to a rectangular plus sign. In this embodiment, within the gauge body 336 are (i) a first pressure sensor 366A (illustrated in FIG. 3B); (ii) a second pressure sensor 366B (illustrated in FIG. 3B); (iii) a third pressure sensor 366C (illustrated in FIG. 3C); (iv) a fourth pressure sensor 366D (illustrated in FIG. 3C); and (v) an in port 370 that can be connected to the fluid source assembly 238 (illustrated in FIG. 2).

Figure 3B:
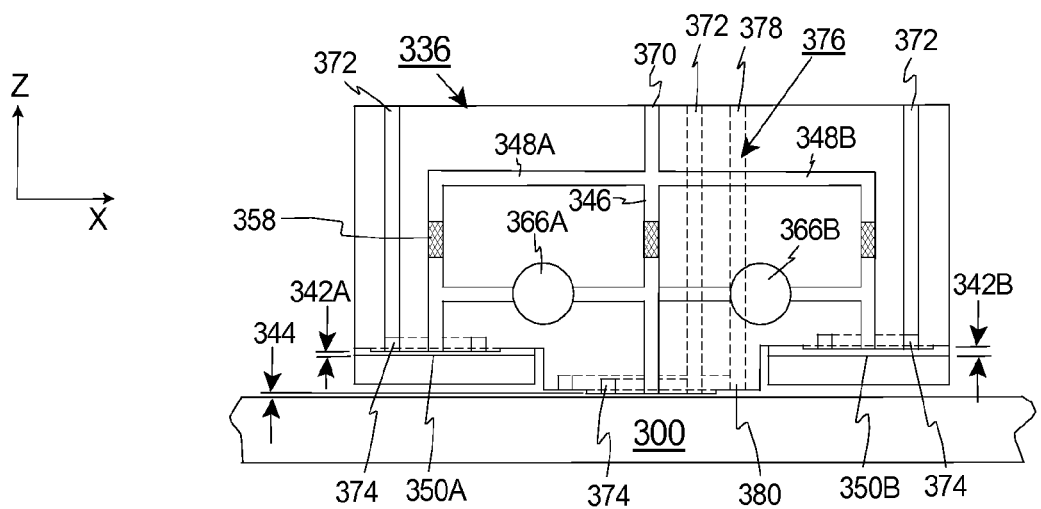
FIG. 3B is a cut-away view taken on line 3B-3B in FIG. 3A.

FIG. 3B is a cut-away view of the gauge body 336 of FIG. 3A and the work piece 300. FIG. 3B illustrates the measurement conduit 346, the first reference conduit 348A, the second reference conduit 348B, the first reference surface 350A, the second reference surface 350B, the measurement gap 344, the first reference gap 342A, the second reference gap 342B, the first pressure sensor 366A, the second pressure sensor 366B, and the in port 370. The flow restrictors 358 for the measurement conduit 346, the first reference conduit 348A, and the second reference 348B are also illustrated. In this embodiment, the measurement gap 344 and the reference gaps 342A-342D extend along the Z axis.

Figure 3C:
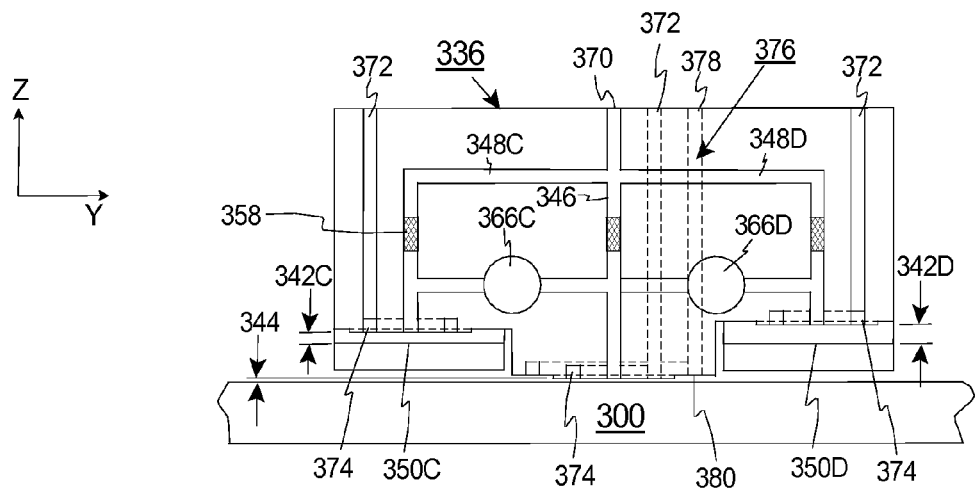
FIG. 3C is a cut-away view taken on line 3C-3C in FIG. 3A.

FIG. 3C is another cut-away view taken of the gauge body 336 of FIG. 3A and the work piece 300. FIG. 3C illustrates the measurement conduit 346, the third reference conduit 348C, the fourth reference conduit 348D, the third reference surface 350C, the fourth reference surface 350D, the measurement gap 344, the third reference gap 342C, the fourth reference gap 342D, the third pressure sensor 366C, the fourth pressure sensor 366D, and the in port 370. The flow restrictors 358 for the measurement conduit 346, the third reference conduit 348C, and the fourth reference 348D are also illustrated.

Figure 3D:
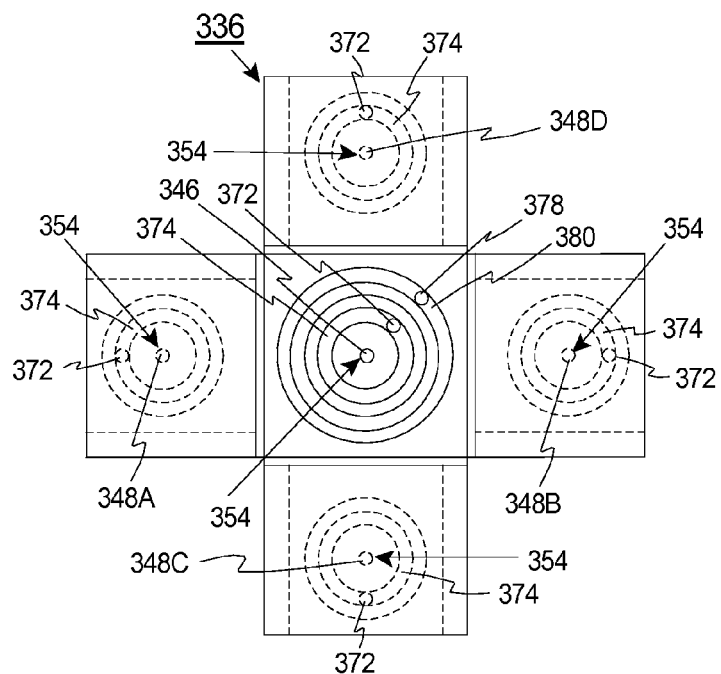
FIG. 3D is a simplified bottom view of the portion of the fluid gauge measurement system of FIG. 3A.

FIG. 3D is a simplified bottom view of the gauge body 336 of FIG. 3A. FIG. 3D illustrates the outlet 354 for the measurement conduit 346, and the reference conduits 348A-348D (illustrated in phantom). In this embodiment, the measurement conduit 346 is substantially centrally located in the gauge body 336 and the reference conduits 348A-348D are spaced apart at ninety degree intervals around the measurement conduit 346.

Referring to FIGS. 3A-3D, in certain embodiments, the gauge body 336 can optionally include a vent passageway 372 for each gap 342A-342D, 344 that allows the fluid to exit the respective gap 342A-342D, 344. In one embodiment, each vent passageway 372 extends through the gauge body 336. Further, each vent passageway 372 can include an annular shaped groove 374 positioned near an inlet to each vent passageway 372 at the respective gap 342A-342D, 344. With this design, in certain embodiments, each vent passageway 372 is configured to exhaust air to an ambient environment. One advantage of the vent passageway 372 is it can largely prevent the exhaust of air from each gap 342A-342D into the immediate vicinity of the gauge body 336, where it might perturb the operation of nearby sensors.

As provided herein, the fluid exiting from the measurement conduit 346 is directed at the work piece 300 and imparts a force on the work piece 300 along the measurement axis (Z axis). The force imparted on the work piece 300 can cause relative movement between the work piece 300 and the gauge body 336 along the measurement axis. This can degrade the accuracy of the measurement of the position of the work piece 300. In certain embodiments, the fluid gauge 322 includes a dynamic compensation system 376 that at least partly compensates and counteracts the force imparted on the work piece 300 by the fluid exiting the measurement conduit 346. The dynamic compensation system 376 can take on a variety of different forms including, but not limited to include, applying a vacuum preload to the work piece 300 and/or utilizing an electromagnetic arrangement to provide attractive forces. In the embodiment illustrated in FIGS. 3A-3D, the dynamic compensation system 376 includes a vacuum conduit 378 having an inlet that is somewhat near the outlet 354 of the measurement conduit 346, a vacuum groove 380 that encircles the outlet 354 of the measurement conduit 346, and a vacuum source (not shown) that creates a vacuum in the vacuum conduit 378. With this design, the pressure in the vacuum conduit 378 can be dynamically adjusted to adjust the vacuum preload force in order to compensate for the force imparted on the work piece 200 by the fluid from the measurement conduit 346. Stated in another fashion, the vacuum preload force can be applied at a magnitude, and in a direction, that substantially opposes the bearing force applied on the work piece 300. An additional discussion of one or more suitable compensation systems is provided in U.S. application Ser. No. 12/879,113, filed on Sep. 10, 2010. As far as permitted, the contents of U.S. application Ser. No. 12/879,113 are incorporated herein by reference.

A further advantage of vent passageway 372 for gap 344 is it largely decouples the air flow from the outlet 354 from perturbations caused by variations in the vacuum in the vacuum conduit during dynamic control adjustments. Such perturbations could affect the gauge properties.

It should be noted that the number and location of the reference gaps 342A-342D can be different than that illustrated in FIGS. 3A-3D. For example, the gauge body 336 can be designed to include more than four or fewer than four reference gaps 342A-342D. Further, the reference gaps 342A-342D can be located at a convenient spot, rather than right next to the measurement gap 344. This can make implementation of the fluid gauge much easier and more compact.

Figure 4A:
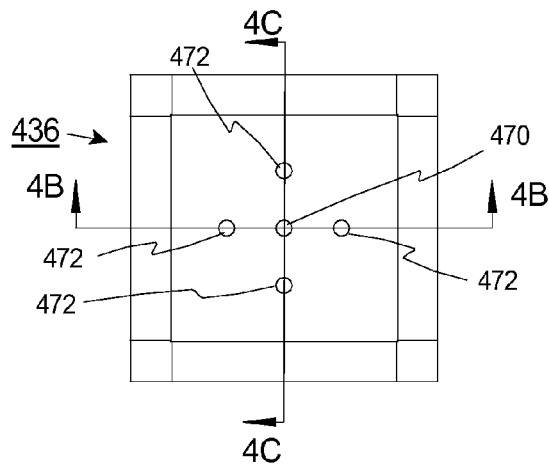
FIG. 4A is a simplified top view of a gauge body having features of the present invention.
Figure 4B:
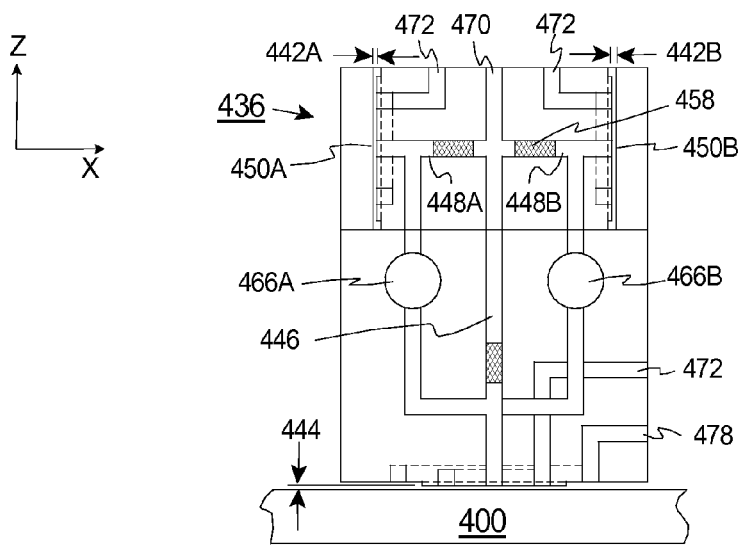
FIG. 4B is a cut-away view of the gauge body taken on line 4B-4B in FIG. 4A with a portion of a work piece.
Figure 4C:
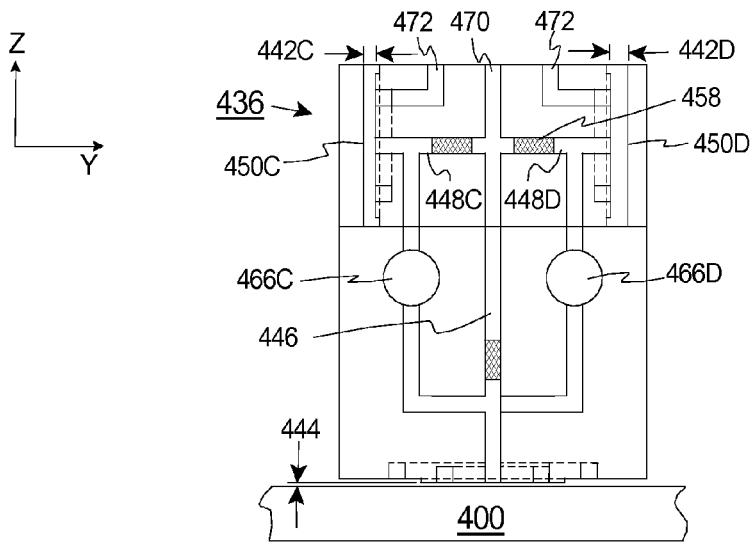
FIG. 4C is a cut-away view of the gauge body taken on line 4C-4C in FIG. 4A with a portion of a work piece.

FIG. 4A is a simplified top view, and FIGS. 4B and 4C are alternative cut-away views of a second embodiment of the gauge body 436 that is somewhat similar to the gauge body 336 described above and illustrated in FIGS. 3A-3D. However, in this embodiment, the reference gaps 442A-442D are located near the sides of the gauge body 436, while the measurement gap 444 is still located at the bottom of the gauge body 436 adjacent to the work piece 400. Stated in another fashion, the reference gaps 442A-442D are oriented substantially transverse to the measurement gap 444. Stated in yet another fashion, in this embodiment, the measurement conduit 446 is substantially centrally located in the gauge body 436 and the reference gaps 442A-442D are spaced apart at ninety degree intervals around the sides of the gauge body 436. In this embodiment, the measurement gap 444 extends along the Z axis and the reference gaps 442A-442D extend transverse to the Z axis.

These Figures also collectively illustrate the first reference conduit 448A, the second reference conduit 448B, the third reference conduit 448C, the fourth reference conduit 448D, the first reference surface 450A, the second reference surface 450B, the third reference surface 450C, the fourth reference surface 450D, the flow restrictors 458, the first pressure sensor 466A, the second pressure sensor 466B, the third pressure sensor 466C, the fourth pressure sensor 466D, the in port 470, the vent passageways 472, and the vacuum conduit 478.

Figure 5A:
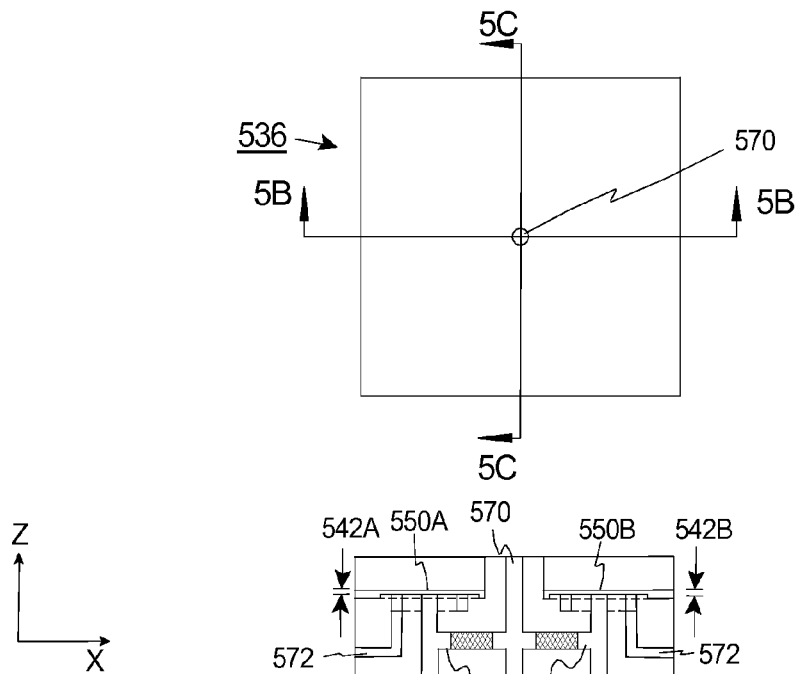
FIG. 5A is a simplified top view of another embodiment of the gauge body.
Figure 5B:
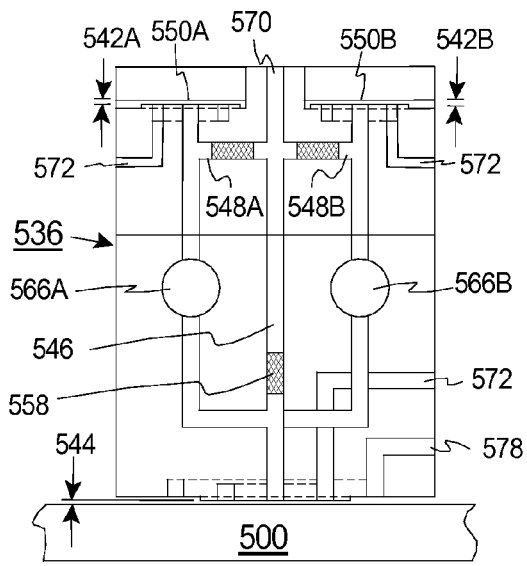
FIG. 5B is a cut-away view of the gauge body taken on line 5B-5B in FIG. 5A with a portion of a work piece.
Figure 5C:
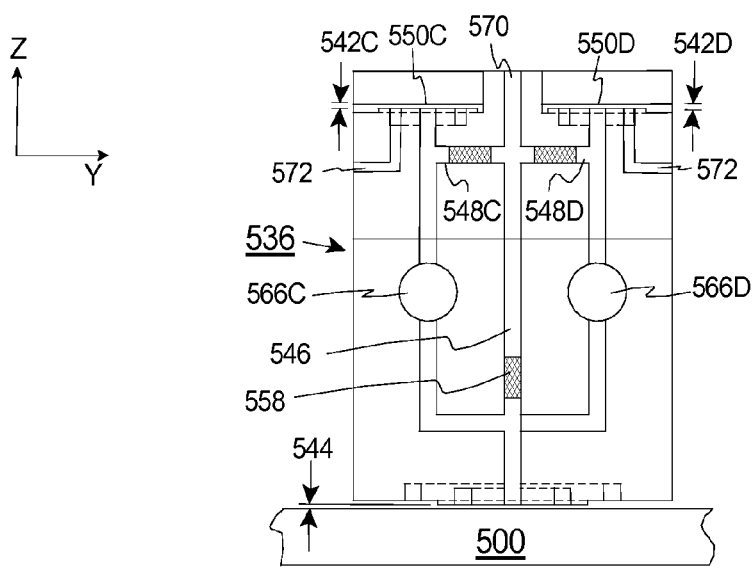
FIG. 5C is a cut-away view of the gauge body taken on line 5C-5C in FIG. 5A with a portion of a work piece.

FIG. 5A is a simplified top view, and FIGS. 5B and 5C are alternative cut-away views of another embodiment of the gauge body 536 that is somewhat similar to the gauge body 336 described above and illustrated in FIGS. 3A-3D. However, in this embodiment, the reference gaps 542A-542D are located near the top of the gauge body 536, while the measurement gap 544 is still located at the bottom of the gauge body 536 adjacent to the work piece 500. Stated in another fashion, the reference gaps 542A-542D are oriented in substantially parallel planes to the measurement gap 544. Stated in yet another fashion, in this embodiment, the measurement conduit 546 is substantially centrally located in the gauge body 536 and the reference gaps 542A-542D are spaced apart at the top of the gauge body 536.

These Figures also collectively illustrate the first reference conduit 548A, the second reference conduit 548B, the third reference conduit 548C, the fourth reference conduit 548D, the first reference surface 550A, the second reference surface 550B, the third reference surface 550C, the fourth reference surface 550D, the flow restrictors 558, the first pressure sensor 566A, the second pressure sensor 566B, the third pressure sensor 566C, the fourth pressure sensor 566D, the in port 570, the vent passageways 572, and the vacuum conduit 578. In this embodiment, the measurement gap 544 and the reference gaps 542A-542D extend along the Z axis.

Figure 6:
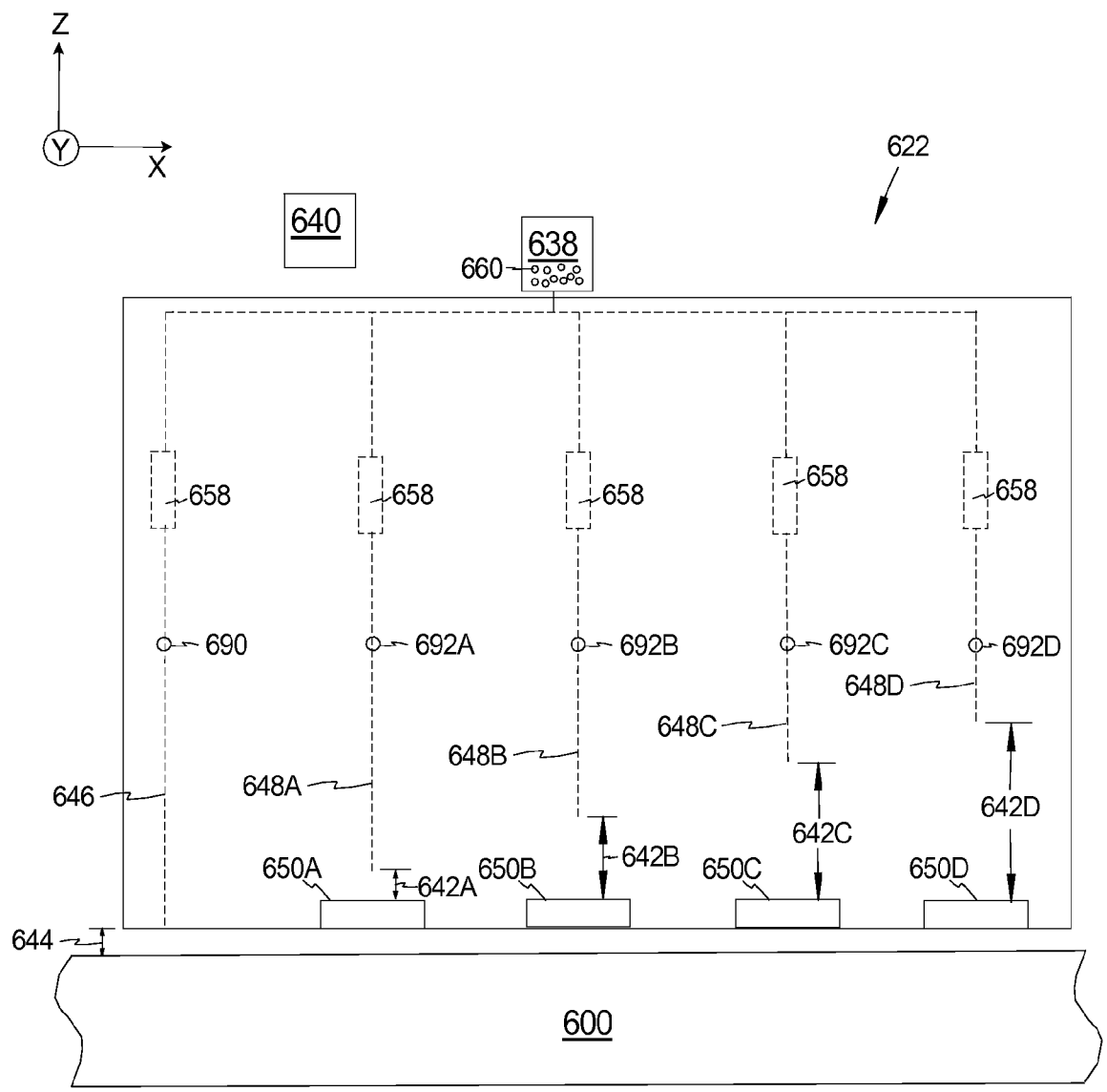
FIG. 6 is a simplified schematic of still another embodiment of a fluid gauge measurement system having features of the present invention and a work piece.

FIG. 6 is a simplified schematic illustration of a work piece 600, and another embodiment of a fluid gauge 622 that is somewhat similar to the fluid gauge 222 described above and illustrated in FIG. 2. However, in this embodiment, instead of pressure sensors 266A-266D (illustrated in FIG. 2), the fluid gauge 622 includes (i) a measurement flow meter 690 that measures the flow of fluid 660 in the measurement conduit 646; (ii) a first flow meter 692A that measures the flow of fluid 660 in the first reference conduit 648A; (ii) a second flow meter 692B that measures the flow of fluid 660 in the second reference conduit 648B; (iii) a third flow meter 692C that measures the flow of fluid 660 in the third reference conduit 648C; and (iv) a fourth flow meter 692D that measures the flow of fluid 660 in the fourth reference conduit 648D. With this design, the gauge control system 640 can monitor and compare the flow rate in the measurement conduit 646 to the flow rates in the reference conduits 648A-648D to determine the size of the measurement gap 644. Stated in another fashion, with this design, a fluid flow induced by the pressure difference between a measurement pressure in the measurement conduit 646 and a reference pressure in the reference conduits 648A-648D can be used to determine the position of the work piece 600.

It should be noted that FIG. 6 also illustrates the reference gaps 642A-642D, the reference surfaces 650A-650D, the flow restrictors 658, and the fluid source 638.

Figure 7:
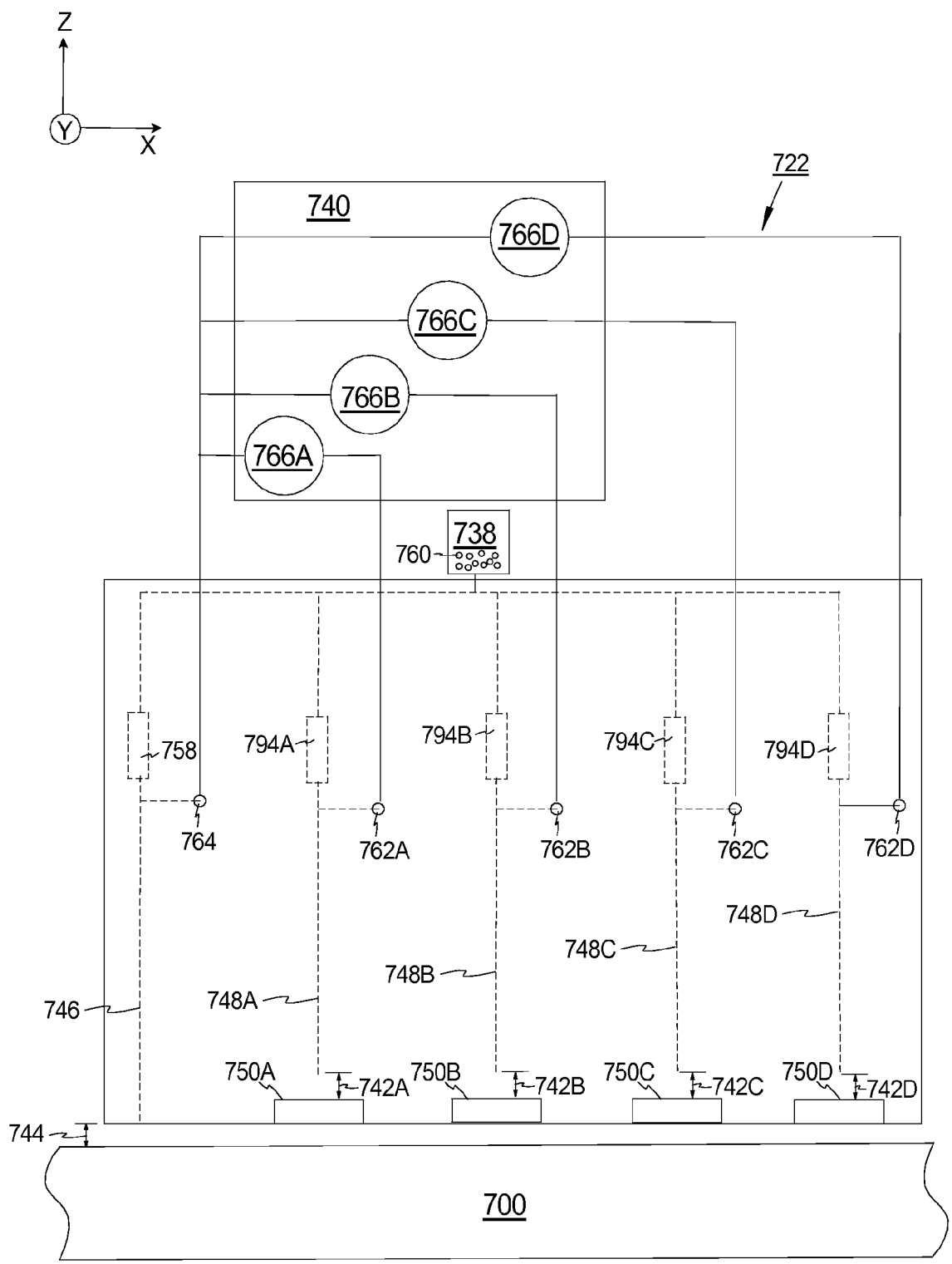
FIG. 7 is a simplified schematic of yet another embodiment of a fluid gauge measurement system having features of the present invention and a work piece.

FIG. 7 is a simplified schematic illustration of a work piece 700, and yet another embodiment of a fluid gauge 722 that is somewhat similar to the fluid gauge 222 described above and illustrated in FIG. 2. However, in this embodiment, instead of the reference gaps 242A-242D (illustrated in FIG. 2) being different in size, in FIG. 7, the reference gaps 742A-742D are each approximately the same size. Further, in this embodiment, the fluid gauge 722 includes (i) a first adjustable flow restrictor 794A that adjustably restricts the flow of fluid 760 in the first reference conduit 748A; (ii) a second adjustable flow restrictor 794B that adjustably restricts the flow of fluid 760 in the second reference conduit 748B; (iii) a third adjustable flow restrictor 794C that adjustably restricts the flow of fluid 760 in the third reference conduit 748C; and (iv) a fourth adjustable flow restrictor 794D that adjustably restricts the flow of fluid 760 in the fourth reference conduit 748D. With design, the corresponding reference pressures 762A-762D can be individually adjusted to the appropriate different values, by adjusting the properties of the flow restrictors 794A-794D of the reference conduits 748A-748D.

As provided herein, as the flow through each flow restrictor 794A-794D is reduced, the pressure drop across the flow restrictor 794A-794D increases. Consequently, the reference pressure decreases 762A-762D. In one non-exclusive embodiment, each adjustable flow restrictor 794A-794D can be individually adjusted so that (i) the first reference pressure 762A is greater than the other reference pressures 762B-762D, (ii) the second reference pressure 762B is greater than the third and fourth reference pressures 762C, 762D, and (iii) the fourth reference pressure 762D is less than the other reference pressures 762A-762C. In this embodiment, the control system 740 compares each reference pressure 762A-762D to the measurement pressure 764 in the measurement conduit 746 to determine the measurement gap 744. Further, in this embodiment, the gauge control system 740 determines which of the pressure differences is the smallest, and determines the position of the work piece 700 along the axis utilizing the pressure difference which is the smallest. With this design, a large dynamic range can be achieved with multiple reference conduits 748A-748D with identical reference gaps 742A-742D and flow restrictors 794A-794D adjusted to produce different reference pressures 762A-762D.

It should be noted that FIG. 7 also illustrates the reference surfaces 750A-750D, the flow restrictor 758, the fluid source 738, the pressure sensors 766A-766D.

It should also be noted that the concepts of the adjustable flow restrictors 794A-794D can be implemented in the other embodiments. Stated in another fashion, a fluid gauge utilizing multiple reference conduits with different reference gaps and adjustable flow restrictors can provide additional means of fine adjustment of the fluid gauge properties.

Figure 8:
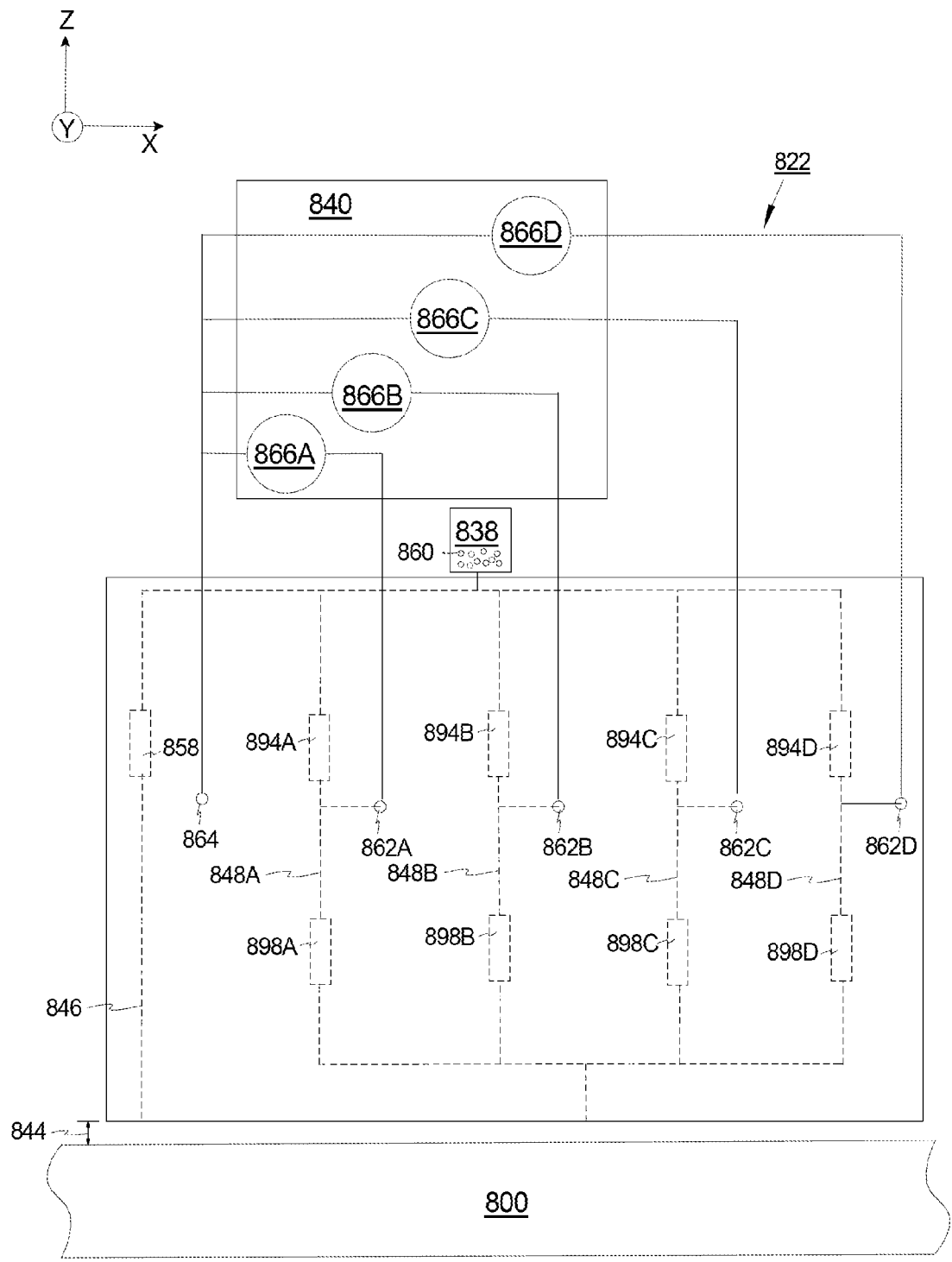
FIG. 8 is a simplified schematic of yet another embodiment of a fluid gauge measurement system having features of the present invention and a work piece.

FIG. 8 is a simplified schematic illustration of a work piece 800, and yet another embodiment of a fluid gauge 822 that is somewhat similar to the fluid gauge 722 described above and illustrated in FIG. 7. However, in this embodiment, the equal sized reference gaps 742A-742D illustrated in FIG. 7 have been replaced with substantially similar reference flow restrictors 898A-898D. In this embodiment, the reference flow restrictors 898A-898D are adjusted to provide approximately the same flow rate. Further, in this embodiment, the reference flow restrictors 898A-898D exhaust to the atmosphere.

Moreover, in this embodiment, the fluid gauge 822 includes (i) a first adjustable flow restrictor 894A that adjustably restricts the flow of fluid 860 in the first reference conduit 848A; (ii) a second adjustable flow restrictor 894B that adjustably restricts the flow of fluid 860 in the second reference conduit 848B; (iii) a third adjustable flow restrictor 894C that adjustably restricts the flow of fluid 860 in the third reference conduit 848C; and (iv) a fourth adjustable flow restrictor 894D that adjustably restricts the flow of fluid 860 in the fourth reference conduit 848D. With design, the corresponding reference pressures 862A-862D can be individually adjusted to the appropriate different values, by adjusting the properties of the flow restrictors 894A-894D of the reference conduits 848A-848D.

In this embodiment, each adjustable flow restrictor 894A-894D can be individually adjusted so that (i) the first reference pressure 862A is greater than the other reference pressures 862B-862D, (ii) the second reference pressure 862B is greater than the third and fourth reference pressures 862C, 862D, and (iii) the fourth reference pressure 862D is less than the other reference pressures 862A-862C. In this embodiment, the control system 840 compares each reference pressure 862A-862D to the measurement pressure 864 in the measurement conduit 846 to determine the measurement gap 844. Further, in this embodiment, the gauge control system 840 determines which of the pressure differences is the smallest, and determines the position of the work piece 800 along the axis utilizing the pressure difference which is the smallest. With this design, a large dynamic range can be achieved with multiple reference conduits 848A-848D, with identical reference restrictors 898A-898D, and adjustable flow restrictors 894A-894D adjusted to produce different reference pressures 862A-862D.

It should be noted that FIG. 8 also illustrates the flow restrictor 858, the fluid source 838, the pressure sensors 866A-866D.

Figure 9A:
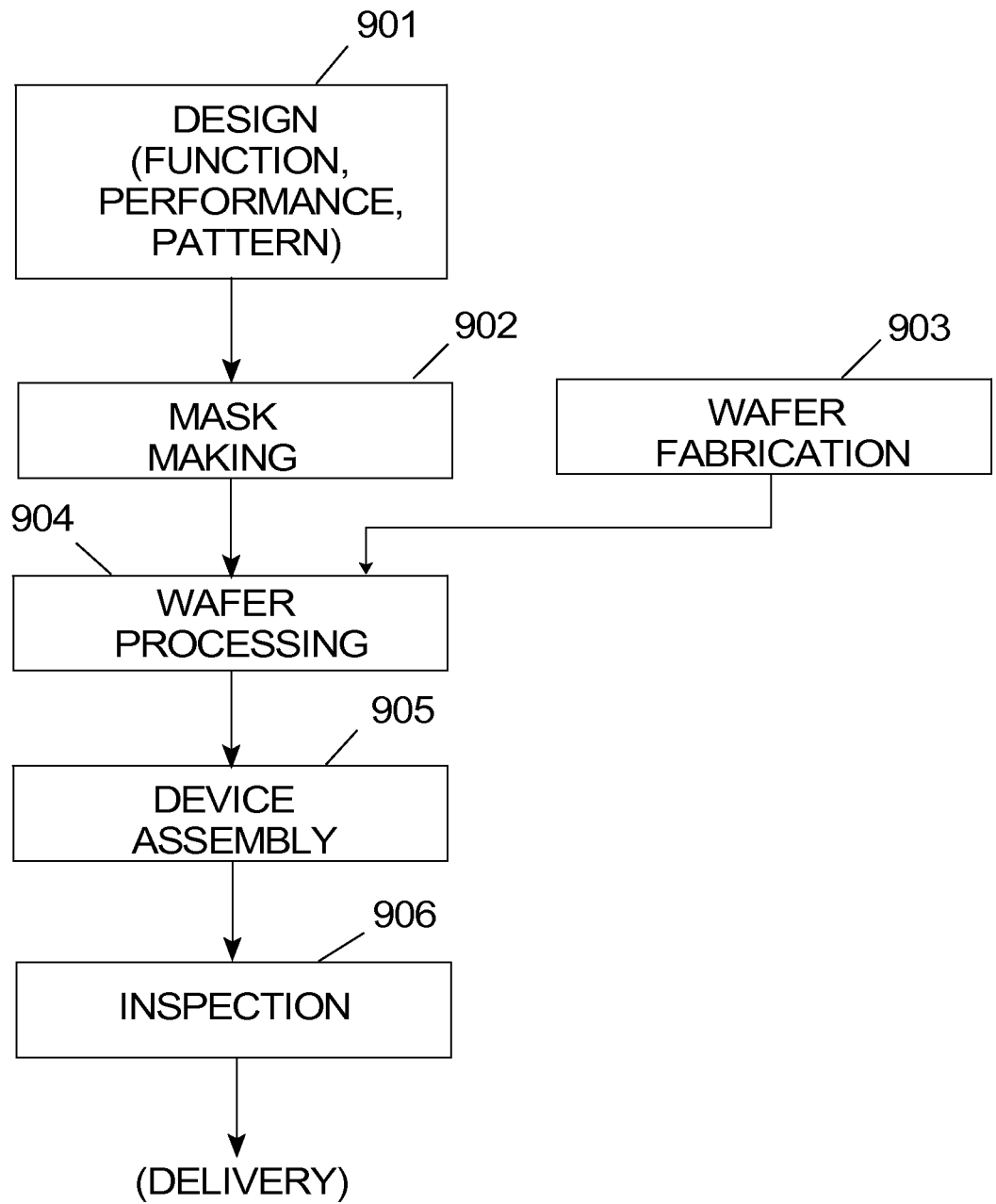
FIG. 9A is a flow chart that outlines a process for manufacturing a device in accordance with the present invention.

Semiconductor devices can be fabricated using the above described systems, by the process shown generally in FIG. 9A. In step 901 the device's function and performance characteristics are designed. Next, in step 902, a mask (reticle) having a pattern is designed according to the previous designing step, and in a parallel step 903 a wafer is made from a silicon material. The mask pattern designed in step 902 is exposed onto the wafer from step 903 in step 904 by a photolithography system described hereinabove in accordance with the present invention. In step 905, the semiconductor device is assembled (including the dicing process, bonding process and packaging process), finally, the device is then inspected in step 906.

Figure 9B:
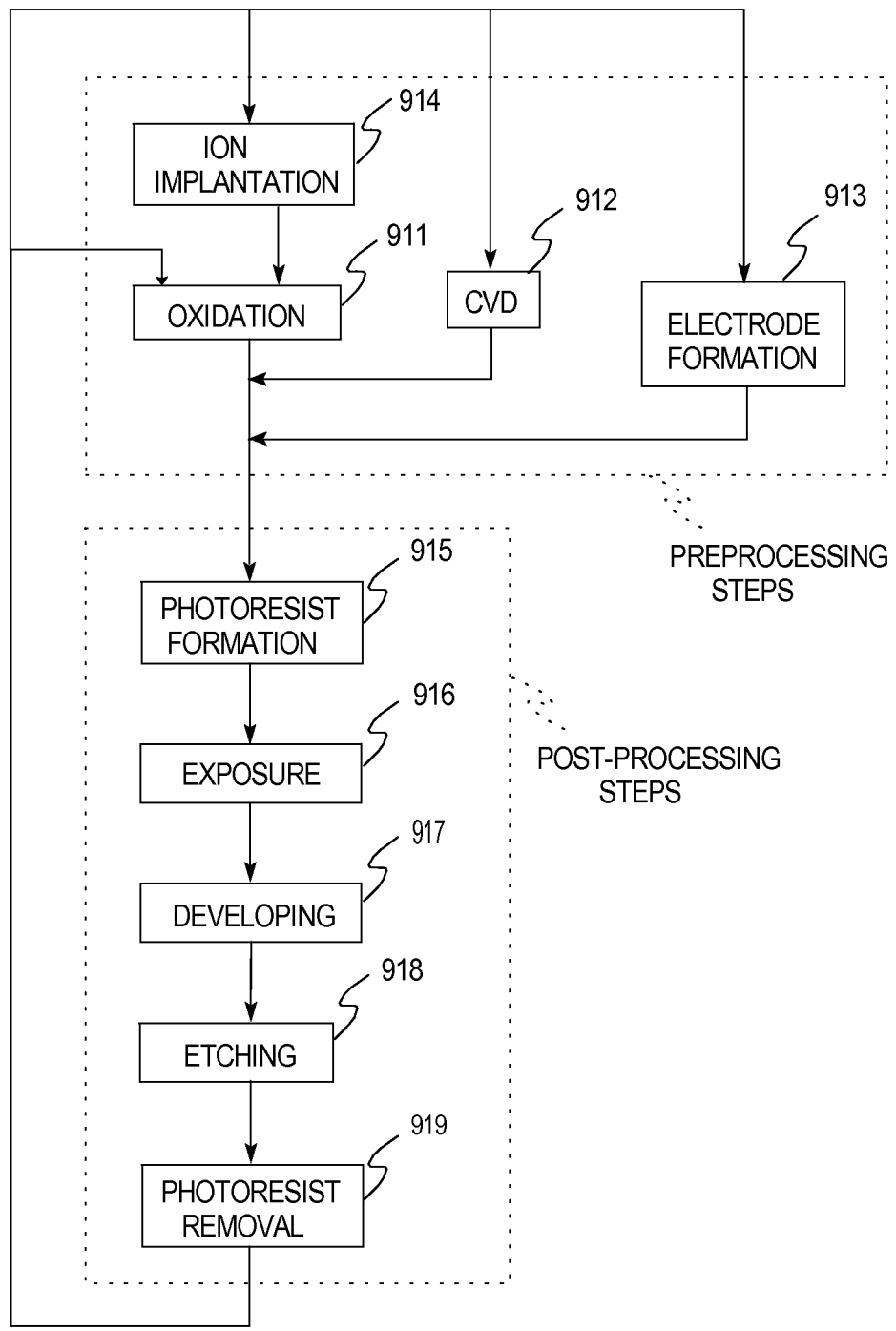
FIG. 9B is a flow chart that outlines device processing in more detail.

FIG. 9B illustrates a detailed flowchart example of the above-mentioned step 904 in the case of fabricating semiconductor devices. In FIG. 9B, in step 911 (oxidation step), the wafer surface is oxidized. In step 912 (CVD step), an insulation film is formed on the wafer surface. In step 913 (electrode formation step), electrodes are formed on the wafer by vapor deposition. In step 914 (ion implantation step), ions are implanted in the wafer. The above mentioned steps 911-914 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 915 (photoresist formation step), photoresist is applied to a wafer. Next, in step 916 (exposure step), the above-mentioned exposure device is used to transfer the circuit pattern of a mask (reticle) to a wafer. Then in step 917 (developing step), the exposed wafer is developed, and in step 918 (etching step), parts other than residual photoresist (exposed material surface) are removed by etching. In step 919 (photoresist removal step), unnecessary photoresist remaining after etching is removed. Multiple circuit patterns are formed by repetition of these preprocessing and post-processing steps.

It is to be understood that gauges disclosed herein are merely illustrative of the presently preferred embodiments of the invention and that no limitations are intended to the details of construction or design herein shown other than as described in the appended claims. In embodiments described as above, the fluid gauge is configured to monitor the position of the wafer relative to the optical assembly and used in conjunction with the autofocus system that monitors position of the wafer relative to the optical assembly. However, the use of the fluid gauge is not limited to monitoring the position of the wafer. For example, the fluid gauge can be configured to monitor the position of the reticle relative to the optical assembly and used in conjunction with the autofocus system that monitors position of the reticle relative to the optical assembly.

What is claimed is:

1. A fluid gauge for measuring the position of a work piece along an axis, the fluid gauge comprising:
   a gauge body that includes a measurement conduit, a first reference conduit, and a second reference conduit, the gauge body is adapted to be positioned so that an outlet of the measurement conduit is positioned adjacent to and spaced apart from the work piece;
   a fluid source assembly that directs a fluid into the measurement conduit, the first reference conduit and the second reference conduit; and a gauge control system that compares a measurement characteristic of the fluid in the measurement conduit, a first reference characteristic of the fluid in the first reference conduit and a second reference characteristic of the fluid in the second reference conduit to determine the position of the work piece along the axis.

2. The fluid gauge of claim 1 wherein the measurement characteristic is a measurement flow rate, the first reference characteristic is a first reference flow rate and the second reference characteristic is a second reference flow rate, and wherein the gauge control system compares the measurement flow rate of the fluid in the measurement conduit to the first reference flow rate and the second reference flow rate in the reference conduits to determine the position of the work piece along the axis.

3. A stage assembly that moves a work piece, the stage assembly including a stage that retains the work piece and the fluid gauge of claim 1 that measures the position of the work piece along the axis.

4. An exposure apparatus including an illumination system and the stage assembly of claim 3 that moves the stage relative to the illumination system.

5. A process for manufacturing a device that includes the steps of providing a substrate and forming an image to the substrate with the exposure apparatus of claim 4.

6. The fluid gauge of claim 1 wherein the measurement characteristic is a measurement pressure, the first reference characteristic is a first reference pressure and the second reference characteristic is a second reference pressure, and wherein the gauge control system determines (i) a first pressure difference between the measurement pressure in the measurement conduit and the first reference pressure in the first reference conduit, and (ii) a second pressure difference between the measurement pressure and the second reference pressure in the second reference conduit.

7. A fluid gauge for measuring the position of a work piece along an axis, the fluid gauge comprising:
a gauge body that includes a measurement conduit, a first reference conduit, a second reference conduit, a first reference surface that is positioned adjacent to and spaced apart a first reference gap from an outlet of the first reference conduit, and a second reference surface that is positioned adjacent to and spaced apart a second reference gap from an outlet of the second reference conduit; wherein the gauge body is adapted to be positioned so that an outlet of the measurement conduit is positioned adjacent to and spaced apart from the work piece; wherein the second reference gap is greater than the first reference gap;
a fluid source assembly that directs a fluid into the measurement conduit, the first reference conduit and the second reference conduit; and
a gauge control system that determines (i) a first pressure difference between a measurement pressure in the measurement conduit and a first reference pressure in the first reference conduit; (ii) a second pressure difference between the measurement pressure and a second reference pressure in the second reference conduit; (iii) which of the pressure differences is the smallest; and (iv) the position of the work piece along the axis utilizing the pressure difference which is the smallest.

8. The fluid gauge of claim 7 wherein the gauge body includes a third reference conduit, and a third reference surface that is positioned adjacent to and spaced apart a third reference gap from an outlet of the third reference conduit; wherein the fluid source assembly directs the fluid into the third reference conduit; and
wherein the gauge control system determines a third pressure difference between the measurement pressure and a third reference pressure in the third reference conduit;
wherein the third reference gap is greater than the second reference gap.

9. The fluid gauge of claim 8 wherein the gauge control system determines which of the pressure differences is the smallest, and determines the position of the work piece along the axis utilizing the pressure difference that is the smallest.

10. A stage assembly that moves a work piece, the stage assembly including a stage that retains the work piece and the fluid gauge of claim 7 that measures the position of the work piece along the axis.

11. An exposure apparatus including an illumination system and the stage assembly of claim 10 that moves the stage relative to the illumination system.

12. A fluid gauge for measuring the position of a work piece along an axis, the fluid gauge comprising:
a gauge body that includes (i) a measurement conduit, (ii) a first reference conduit, (iii) a first reference surface that is positioned adjacent to and spaced apart a first reference gap from an outlet of the first reference conduit, (iv) a second reference conduit, and (v) a second reference surface that is positioned adjacent to and spaced apart a second reference gap from an outlet of the second reference conduit, the gauge body being adapted to be positioned so that an outlet of the measurement conduit is positioned adjacent to and spaced apart from the work piece;
a fluid source assembly that directs a fluid into the measurement conduit, the first reference conduit and the second reference conduit; and
a gauge control system that determines the position of the work piece along the axis based on information about the fluid in the conduits.

13. The fluid gauge of claim 12 wherein the gauge control system determines (i) a first pressure difference between a measurement pressure in the measurement conduit and a first reference pressure in the first reference conduit, and (ii) a second pressure difference between the measurement pressure and a second reference pressure in the second reference conduit.

14. The fluid gauge of claim 13 wherein the second reference gap is greater than the first reference gap, and wherein the gauge control system determines which of the pressure differences is the smallest and determines the position of the work piece along the axis utilizing the pressure difference which is the smallest.

15. The fluid gauge of claim 13 wherein the gauge body includes a third reference conduit, and a third reference surface that is positioned adjacent to and spaced apart a third reference gap from an outlet of the third reference conduit;
wherein the fluid source assembly directs the fluid into the third reference conduit; and
wherein the gauge control system determines a third pressure difference between the measurement pressure and a third reference pressure in the third reference conduit.

16. The fluid gauge of claim 15 wherein the third reference gap is greater than the second reference gap; and wherein the second reference gap is greater than the first reference gap.

17. The fluid gauge of claim 16 wherein the gauge control system determines which of the pressure differences is the smallest, and wherein the control system determines the position of the work piece along the axis utilizing the pressure difference which is the smallest.

18. A method for measuring the position of a work piece along an axis that is orthogonal to a working surface of the work piece, the method comprising the steps of:
providing a gauge body that includes a measurement conduit, a first reference conduit, and a second reference conduit;
positioning the gauge body so that an outlet of the measurement conduit is positioned adjacent to and spaced apart from the work piece;
directing a fluid into the measurement conduit, the first reference conduit and the second reference conduit with a fluid source assembly; and
comparing a measurement characteristic of the fluid in the measurement conduit, a first reference characteristic of the fluid in the first reference conduit and a second reference characteristic of the fluid in the second reference conduit with a gauge control system to determine the position of the work piece along the axis.

19. The method of claim 18 wherein the step of comparing includes the measurement characteristic being a measurement pressure, the first reference characteristic being a first reference pressure and the second reference characteristic being a second reference pressure, and further includes the steps of (i) determining a first pressure difference between the measurement pressure in the measurement conduit and the first reference pressure in the first reference conduit with the gauge control system; and (ii) determining a second pressure difference between the measurement pressure and the second reference pressure in the second reference conduit with the gauge control system.

20. The method of claim 18 wherein the step of comparing includes the measurement characteristic being a measurement flow rate, the first reference characteristic being a first reference flow rate and the second reference characteristic being a second reference flow rate, and further includes the step of monitoring the measurement flow rate of the fluid in the measurement conduit as compared to the first reference flow rate and the second reference flow rate in the reference conduits.

21. A fluid gauge for measuring the position of a work piece along an axis, the fluid gauge comprising:
a gauge body that includes a measurement conduit, a first reference conduit, and a second reference conduit, the gauge body is adapted to be positioned so that an outlet of the measurement conduit is positioned adjacent to and spaced apart from the work piece;
a fluid source assembly that directs a fluid into the measurement conduit, the first reference conduit and the second reference conduit;
a first flow restrictor that adjustably controls a first reference pressure in the first reference conduit;
a second flow restrictor that adjustably controls a second reference pressure in the second reference conduit so that the second reference pressure is different than the first reference pressure; and
a gauge control system that determines the position of the work piece along the axis based on information about the fluid in the conduits.

22. A method for measuring the position of a work piece along an axis that is orthogonal to a working surface of the work piece, the method comprising the steps of:
providing a gauge body that includes a measurement conduit, a first reference conduit, and a second reference conduit, the gauge body defining a first reference surface that is positioned adjacent to and spaced apart from an outlet of the first reference conduit, and a second reference surface that is positioned adjacent to and spaced apart from an outlet of the second reference conduit;
positioning the gauge body so that an outlet of the measurement conduit is positioned adjacent to and spaced apart from the work piece;
directing a fluid into the measurement conduit, the first reference conduit and the second reference conduit with a fluid source assembly; and
determining the position of the work piece along the axis with a gauge control system utilizing information about the fluid in the conduits.

23. The method of claim 22 wherein the step of providing a gauge body includes the first reference surface being spaced apart a first reference gap from the outlet of the first reference conduit, and the second reference surface being spaced apart a second reference gap from the outlet of the second reference conduit; and wherein the second reference gap is greater than the first reference gap.

24. The method of claim 22 wherein the step of determining includes the steps of (i) determining a first pressure difference between a measurement pressure in the measurement conduit and a first reference pressure in the first reference conduit with the gauge control system; and (ii) determining a second pressure difference between the measurement pressure and a second reference pressure in the second reference conduit with the gauge control system.

25. The method of claim 24 further comprising the step of determining which of the pressure differences is the smallest with the gauge control system and utilizing the pressure difference which is the smallest with the gauge control system.

26. The method of claim 24 wherein the step of providing a gauge body includes the gauge body having a third reference conduit, and a third reference surface that is positioned adjacent to and spaced apart from an outlet of the third reference conduit; wherein the step of directing includes the step of directing the fluid into the third reference conduit; and further comprising the step of determining a third pressure difference between the measurement pressure and a third reference pressure in the third reference conduit with the gauge control system.

27. A method for measuring the position of a work piece along an axis that is orthogonal to a working surface of the work piece, the method comprising the steps of:
providing a gauge body that includes a measurement conduit, a first reference conduit, and a second reference conduit;
positioning the gauge body so that an outlet of the measurement conduit is positioned adjacent to and spaced apart from the work piece;
directing a fluid into the measurement conduit, the first reference conduit and the second reference conduit with a fluid source assembly;
adjustably controlling a first reference pressure in the first reference conduit,
adjustably controlling a second reference pressure in the second reference conduit so that the second reference pressure is different than the first reference pressure and
determining the position of the work piece along the axis with a gauge control system utilizing information about the fluid in the conduits.

* * * * *